(12) United States Patent
Yamasaki et al.

(10) Patent No.: US 6,715,415 B2
(45) Date of Patent: Apr. 6, 2004

(54) SCREEN PRINTING APPARATUS HAVING ROTATABLE UNITED SQUEEGEE PAIR, AND METHOD OF SCREEN PRINTING USING SAID APPARATUS

(75) Inventors: Kimiyuki Yamasaki, Fukuoka (JP); Seiko Abe, Fukuoka (JP); Seiichi Miyahara, Fukuoka (JP); Michinori Tomomatsu, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 69 days.

(21) Appl. No.: 10/120,399

(22) Filed: Apr. 12, 2002

(65) Prior Publication Data

US 2002/0148369 A1 Oct. 17, 2002

(30) Foreign Application Priority Data

Apr. 12, 2001 (JP) ........................................ 2001-113693

(51) Int. Cl.[7] ................................................ B41F 15/44
(52) U.S. Cl. ..................................................... 101/123
(58) Field of Search ................................ 101/123, 124, 101/129; 118/413

(56) References Cited

U.S. PATENT DOCUMENTS

| | | | | |
|---|---|---|---|---|
| 3,656,428 A | * | 4/1972 | Duncan | 101/129 |
| 4,173,185 A | * | 11/1979 | Voegelin | 101/120 |
| 4,622,239 A | * | 11/1986 | Schoenthaler et al. | 427/96 |
| 4,715,278 A | * | 12/1987 | Ericsson | 101/123 |
| 4,720,402 A | * | 1/1988 | Wojcik | 427/282 |
| 4,949,636 A | * | 8/1990 | Tachibana | 101/123 |
| 4,995,316 A | * | 2/1991 | Kolblin et al. | 101/123 |
| 5,440,980 A | * | 8/1995 | Murakami et al. | 101/123 |
| 5,996,487 A | | 12/1999 | Tomomatsu et al. | 101/123 |
| 6,092,463 A | * | 7/2000 | Onishi et al. | 101/129 |
| 6,105,495 A | * | 8/2000 | Takahashi et al. | 101/123 |
| 6,135,024 A | * | 10/2000 | Higashida et al. | 101/123 |
| 6,171,399 B1 | * | 1/2001 | Kaiser et al. | 118/406 |

FOREIGN PATENT DOCUMENTS

| | | | |
|---|---|---|---|
| JP | 56-28860 | * | 3/1981 |
| JP | 60-46249 | * | 3/1985 |
| JP | 5-254090 | * | 10/1993 |
| JP | 08-323956 | | 12/1996 |
| JP | 2000-140739 | * | 5/2000 |
| JP | 2000-255029 | | 9/2000 |

* cited by examiner

*Primary Examiner*—Stephen R. Funk
(74) *Attorney, Agent, or Firm*—Wenderoth, Lind & Ponack, L.L.P.

(57) ABSTRACT

A screen printing method and apparatus are capable of maintaining a constant attack angle between a squeegee and a mask plate, regardless of the surface condition of the mask plate. A squeegee head, including a pair of squeegees, is rotatably supported by a retainer with respect to a horizontal axis that is at a right angle to a squeegeeing direction. The rotatably supported squeegee head is pushed by a cylinder against the mask plate. Accordingly, the attack angle is kept constant to improve the printing quality even if a substrate has a curved portion.

17 Claims, 6 Drawing Sheets

SCREEN PRINTING APPARATUS HAVING ROTATABLE UNITED SQUEEGEE PAIR, AND METHOD OF SCREEN PRINTING USING SAID APPARATUS

CROSS REFERENCE TO RELATED APPLICATION

This application is based upon and claims the benefit of priority of Japanese Patent Application No. 2001-113693 filed on Apr. 12, 2001, the contents of which are incorporated herein by reference.

BACKGROUND OF THE INVENTION

1. Field of the Invention

The present invention relates to a screen printing apparatus for printing paste, such as cream solder or conductive paste, onto a substrate, and a method of screen printing.

2. Description of Related Art

In an electronic-parts-mounting process, screen printing is employed for printing paste, such as cream solder or conductive paste, onto a substrate. In the screen printing, a mask plate having pattern apertures corresponding to the places to be printed is placed over a substrate, and paste is printed onto the substrate through the pattern apertures by using a squeegee method.

In a conventional squeegee method and apparatus, such as disclosed in U.S. Pat. No. 5,996,487, Laid Open Japanese Patent H-8-323956 and Laid Open Japanese Patent 2000-255029, a lower edge of a plate-shaped squeegee slides in contact with a surface of the mask plate. The squeegee slides while being slanted relative to its squeegee-moving direction to form a predetermined attack angle between the squeegee and the surface of the mask plate. A squeegee head has a pair of squeegees whose squeegee-moving directions are opposite each other. Each squeegee is individually operated in turn. Accordingly, the squeegees alternately carry out the squeegeeing operation by reciprocating the squeegee head.

The attack angle is required to be constant during the squeegeeing operation in order to maintain a stable printing condition for the screen printing. However, if the surface of the substrate is warped or has undulations, the attack angle changes according to the degree of the warp of the surface of the substrate. In that case, the printing condition becomes unstable and the amount of the cream solder supplied from the squeegee head fluctuates.

SUMMARY OF THE INVENTION

Accordingly, it is an object of the present invention to provide a screen printing apparatus and method capable of stabilizing the printing condition and improving the printing quality.

According to a first aspect of the present invention, a screen printing apparatus has a squeegee head for printing paste onto a substrate, a horizontal driver for moving the squeegee head in a horizontal direction on a mask plate, a vertical driver for moving the squeegee head in a vertical direction with respect to the mask plate, and a presser for generating pressure to push the squeegee head against the mask plate. The squeegee head includes a pair of squeegees having opposite squeegeeing directions, each of the squeegees having a lower end for sliding in contact with the mask plate with a predetermined attack angle with respect to the squeegeeing directions, respectively, a retainer for connecting the squeegees and for retaining the squeegees so that they are rotatable with respect to a horizontal axis that is at a right angle to the squeegeeing directions, and a paste cell for storing the paste between the squeegees and the mask plate when the squeegees are in contact with the mask plate. Accordingly, the attack angle is kept constant to improve the printing quality even if a substrate has a curved portion or is in a slanted condition.

According to another aspect of the present invention, a method of screen printing for printing paste onto a substrate via a pattern aperture of a mask plate by sliding a pair of squeegees on a mask plate, includes the steps of placing a first substrate under the mask plate, lowering the squeegees to make contact with the mask plate, holding the squeegees so that they are movable on the mask plate such that an attack angle formed between the squeegees and the mask plate is an acute angle while maintaining the contact between the squeegees and the mask plate, supplying paste to a paste cell formed between the squeegees and the mask plate when the squeegees are in contact with the mask plate, sliding the squeegees on the mask plate in a first direction to complete the printing of the paste onto the first substrate while holding the squeegees so that they are movable on the mask plate and such that the attack angle formed between the squeegees and the mask plate is kept constant, replacing the first substrate with a second substrate, and sliding the squeegees on the mask plate in a second direction opposite to the first direction to complete the printing of the paste onto the second substrate while holding the squeegees so that they are movable on the mask plate and such that the attack angle formed between the squeegees and the mask plate is kept constant. Accordingly, the attack angle is kept constant to improve the printing quality even if a substrate has a curved portion or is in a slanted condition.

According to another aspect of the present invention, a method of screen printing for printing solder onto a substrate via a pattern aperture of a mask plate by sliding a pair of squeegees on the mask plate, includes the steps of placing a first substrate under the mask plate, lowering the squeegees to make contact with the mask plate such that an acute angle is formed between the squeegees and the mask plate with respect to a squeegeeing direction of each squeegee, supplying the solder to a solder cell formed between the squeegees and the mask plate when the squeegees are in contact with the mask plate, sliding the squeegees on the mask plate in a first direction to complete the printing of the solder onto the first substrate, replacing the first substrate with a second substrate; and sliding the squeegees on the mask plate in a second direction opposite to the first direction to complete the printing of the solder onto the second substrate. Accordingly, it is not necessary to lift and lower each squeegee for switching the squeegee when the squeegeeing direction is reversed. Therefore, loss of time caused by lifting and lowering each squeegee is prevented, and the efficiency of the screen printing is improved.

BRIEF DESCRIPTION OF THE DRAWINGS

Other features and advantages of the present invention, as well as methods of operation and the function of the related parts of the invention, will be appreciated from a study of the following detailed description, the appended claims, and the drawings, all of which form a part of this application. In the drawings:

DETAILED DESCRIPTION OF THE PREFERRED EMBODIMENTS

First Embodiment

Figure 1:
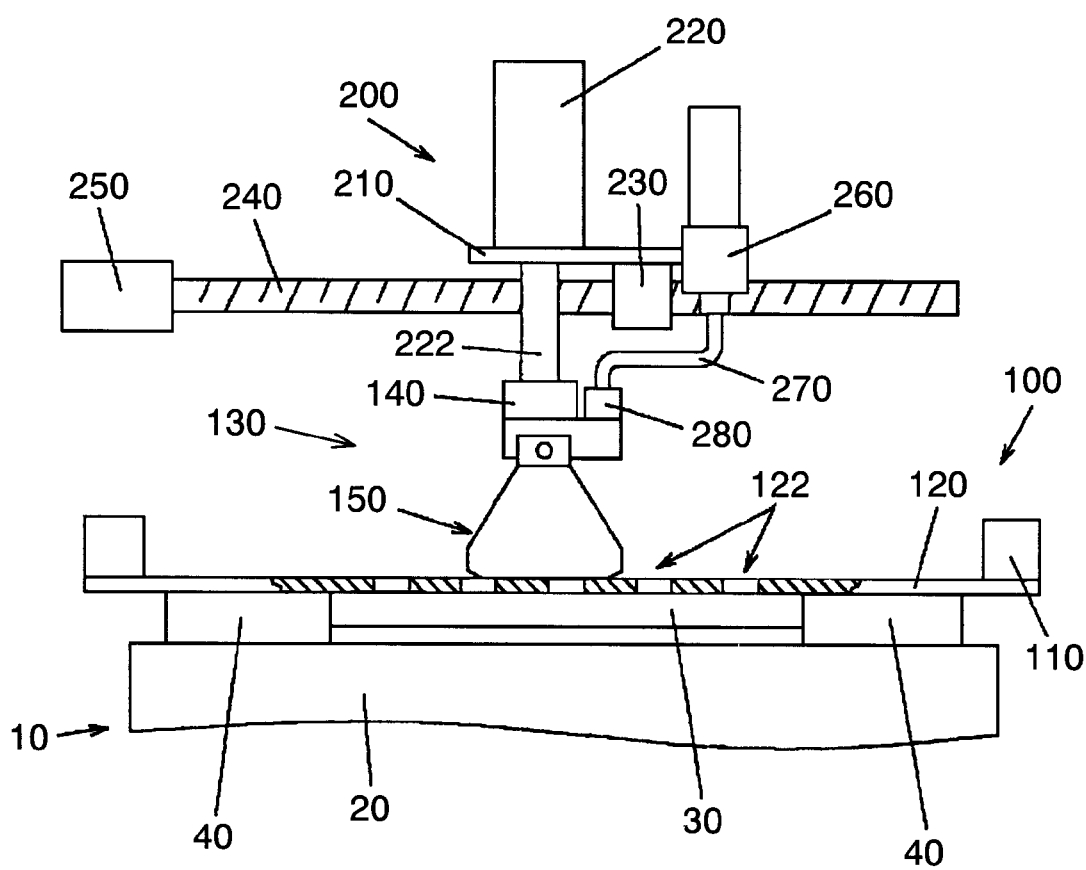
FIG. 1 is a front view of a screen printing apparatus according to a first embodiment of the present invention.
Figure 2:
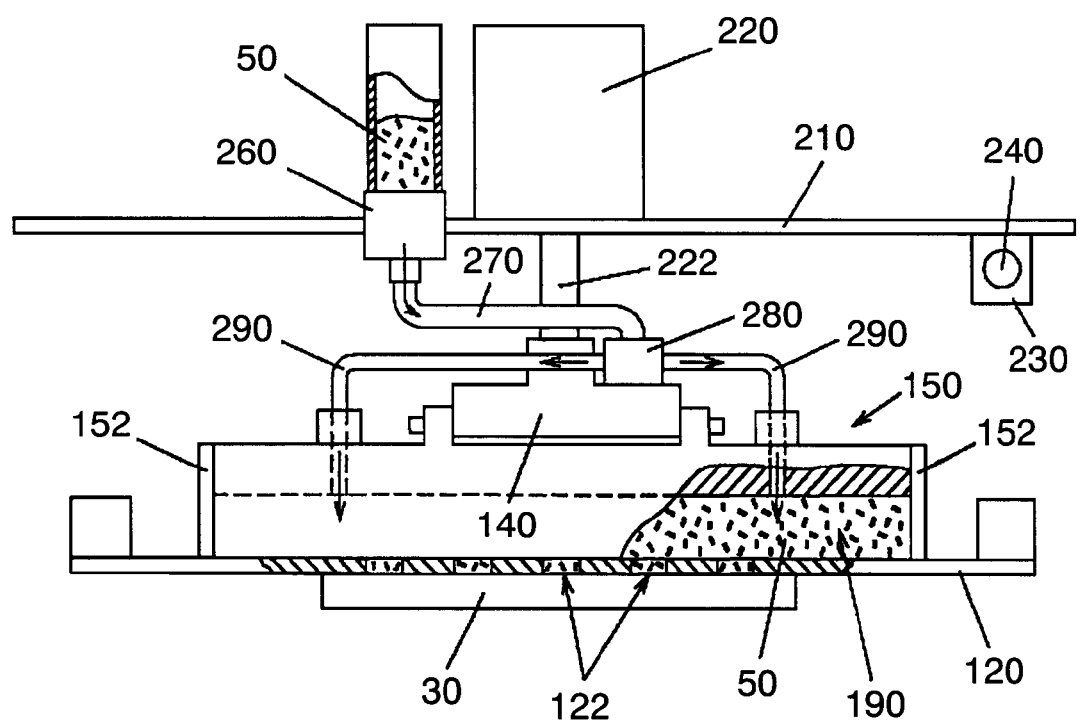
FIG. 2 is a partially sectional side view of the screen printing apparatus according to the first embodiment of the present invention.

Referring to FIGS. 1 and 2, a substrate positioning member 10 comprises a substrate holder 20 provided on a movable table (not shown), and a clamp 40 connected to the substrate holder 20. A substrate 30 (to be printed on) is held by the clamp 40 and positioned horizontally and vertically by driving the movable table.

A screen mask 100 comprises a mask plate 120 attached to a holder 110, and is provided above the substrate positioning member 10. The mask plate 120 has pattern apertures 122, which correspond to printing locations on the substrate 30, for use in forming a printing pattern on the substrate 30.

A squeegee head 130 is located above the screen mask 100 and can be moved up and down by means of a head lift 200. The head lift 200 is equipped with a piston/cylinder 220 provided on a plate 210.

The squeegee head 130 is coupled with a lower end of a piston rod 222 attached to a piston of the piston/cylinder 220. The squeegee head 130 moves up and down with respect to the mask plate 120 by operating the piston/cylinder (or simply "cylinder") 220. The cylinder 220 also pushes the squeegee head 130 onto the mask plate 120.

A nut 230 is fixed to the plate 210 of the head lift 200. A motor 250 drives a feed screw 240 which is engaged with the nut 230. Accordingly, the squeegee head 130 coupled with the head lift 200 and the plate 210 are moved horizontally by driving the motor 250. The squeegee head 130 moves horizontally on the mask plate 120 while maintaining contact with the mask plate 120 when the motor 250 is driven under the condition that the squeegee head 130 is in a down position.

Figure 3A:
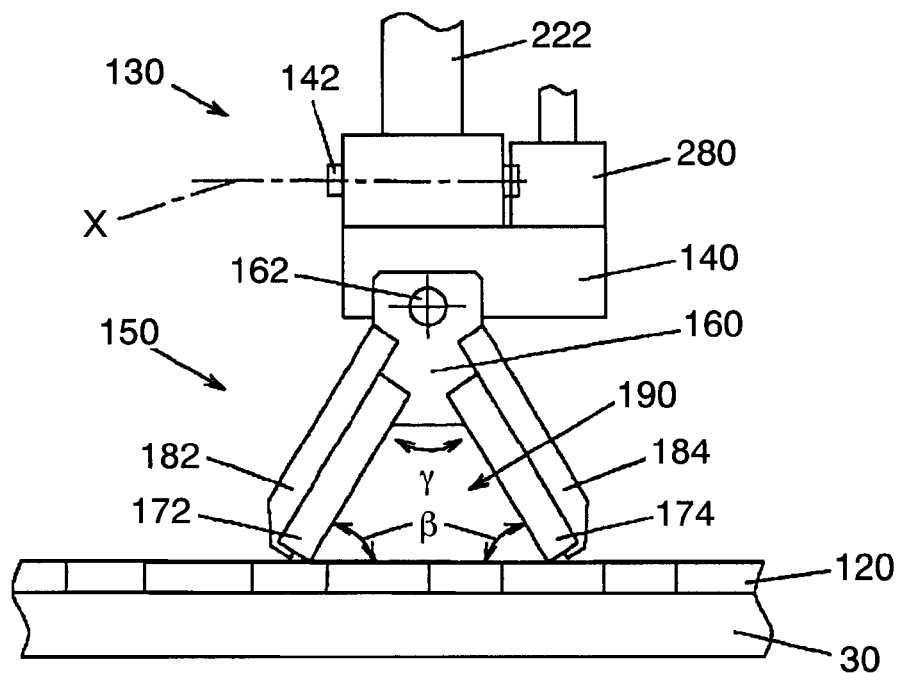
FIG. 3A is a schematic front view showing a squeegee head of the screen printing apparatus according to the first embodiment of the present invention.
Figure 3B:
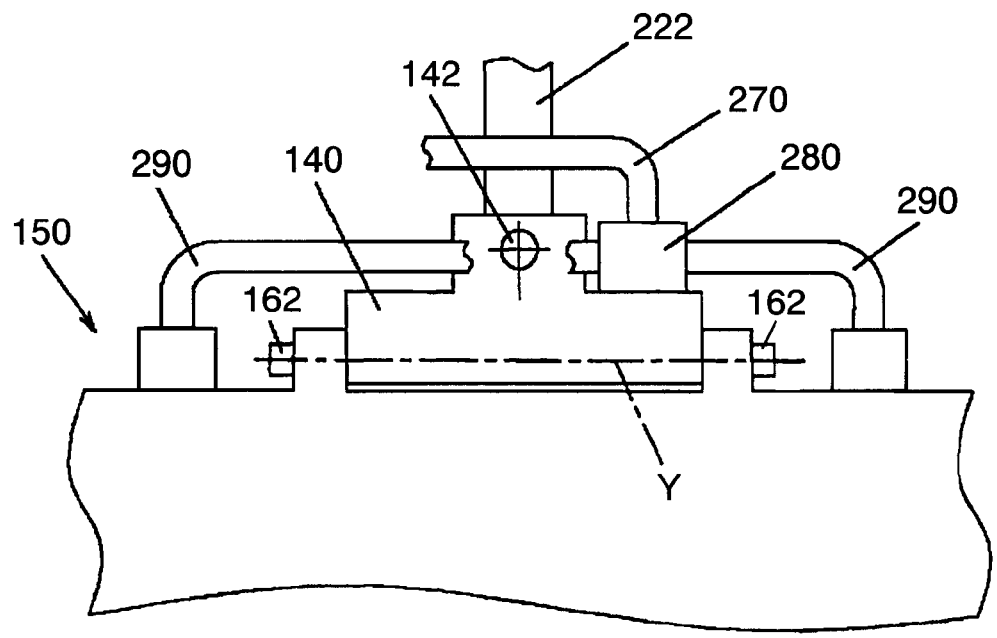
FIG. 3B is a schematic side view of a part of the squeegee head of the screen printing apparatus according to the first embodiment of the present invention.

Referring to FIGS. 3A and 3B, the detailed structure of the squeegee head 130 will now be described. A retaining block 140 is connected to the lower end of the rod 222 such that the retaining block 140 is rotatable with respect to a pin 142, that is rotatable with respect to a horizontal X-axis shown in FIG. 3A.

A squeegee unit 150 is connected to a lower end of the retaining block 140. Holding plates 182 and 184 hold and fix squeegees 172 and 174 to a connecting block 160 to form the squeegee unit 150 such that the squeegees 172 and 174 form a predetermined connection angle γ. The squeegees 172 and 174 may be made of urethane or stainless steel. The connecting block 160 is connected to a lower end of the retaining block 140 such that the connecting block 160 is rotatable with respect to a pin 162, that is with respect to a horizontal Y-axis shown in FIG. 3B.

Accordingly, the squeegee unit 150 is coupled with the rod 222 of the cylinder 220 such that the squeegee unit 150 is rotatable with respect to the X-axis and the Y-axis. The X-axis is parallel with the squeegeeing direction. The X-axis and the Y-axis are at right angles to one another.

The squeegee head 130 is lowered by protruding the rod 222 as shown in FIG. 3A. Under this condition shown in FIG. 3A, the lower ends of the squeegees 172 and 174 slide in contact with the mask plate 120 while maintaining a predetermined attack angle β. The mask plate 120, the squeegees 172 and 174 and a pair of enclosing plates 152 form a paste cell 190 for storing cream solder 50 since the enclosing plates 152 are attached to both sides of the squeegee unit 150 as shown in FIG. 2.

Figure 4:
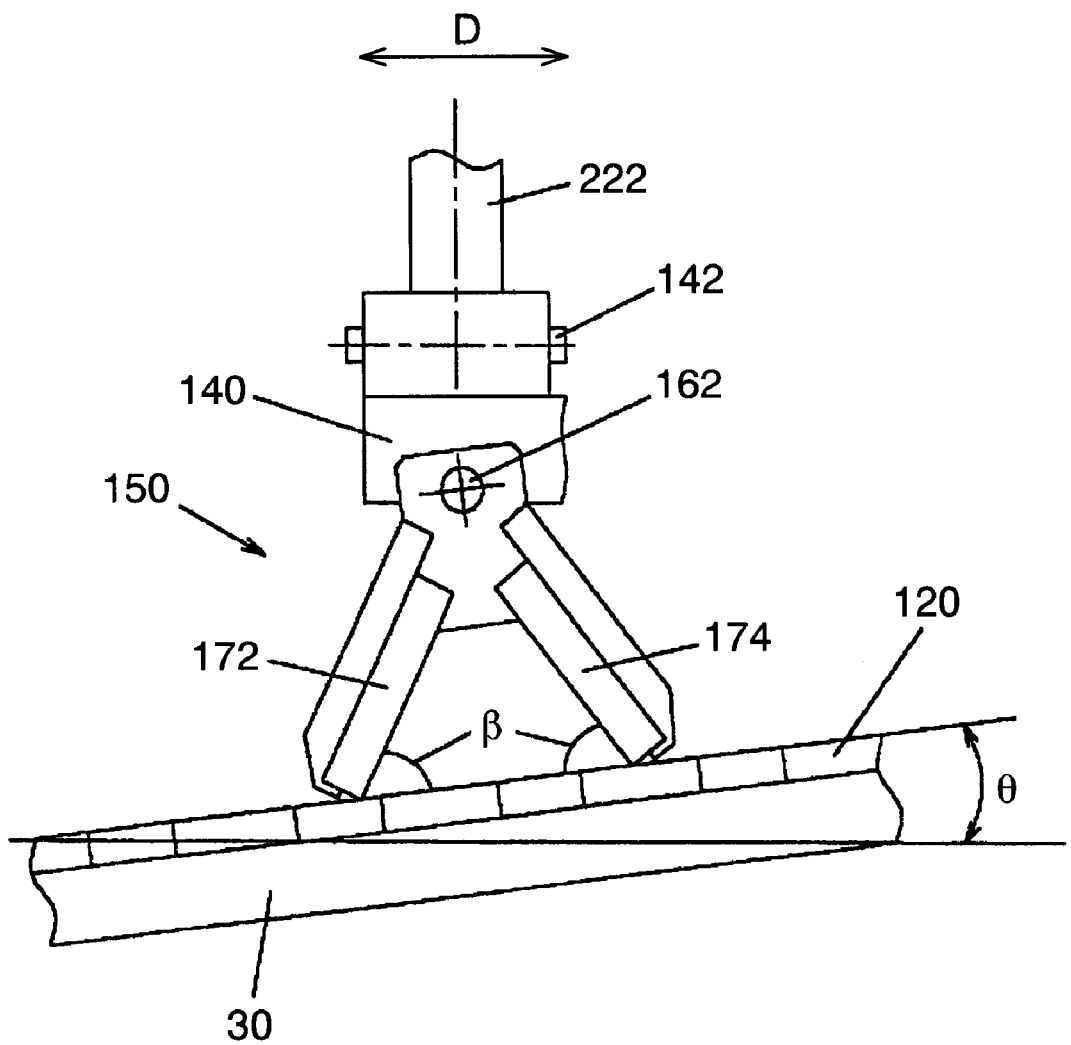
FIG. 4 is a schematic front view of the squeegee head of the screen printing apparatus showing a squeegeeing mechanism for a substrate having a slant θ according to the first embodiment of the present invention.

Accordingly, the lower ends of the squeegees 172 and 174 keep following the shape of the surface of the mask plate 120 during the squeegeeing operations because the squeegee unit 150 is capable of rotating around the X-axis and the Y-axis. One example is shown in FIG. 4 in which the mask plate 120 has a slant angle θ in the squeegee-moving direction. In FIG. 4, an arrow D represents the squeegee-moving direction, that is screen printing direction. In this example shown in FIG. 4, the lower ends of the squeegees 172 and 174 keep following the slant of the surface of the mask plate 120 during the squeegeeing operations because the squeegee head 130 rotates around the Y-axis shown in FIG. 3B.

Since the connection angle γ between the squeegees 172 and 174 is fixed, each attack angle β, is kept constant regardless of the slant condition of the mask plate 120.

Similarly, the squeegee unit 150 keeps the attack angle β constant and follows the surface of the mask plate 120 by rotating the squeegee head 130 around the X-axis shown in FIG. 3A even if the mask plate 120 slants relative to a direction perpendicular to the screen printing direction.

Referring to FIGS. 1 and 2, a syringe pump 260 is supported by the plate 210. The cream solder 50 is stored in the syringe pump 260. A solder supply tube 270 connects the syringe pump 260 with a branch block 280 fixed to the retaining block 140. A pair of solder supply tubes 290 connects the branch block 280 with the paste cell 190 of the squeegee unit 150. Accordingly, the cream solder 50 is supplied to the paste cell 190 by driving the syringe pump 260.

Figure 5A:
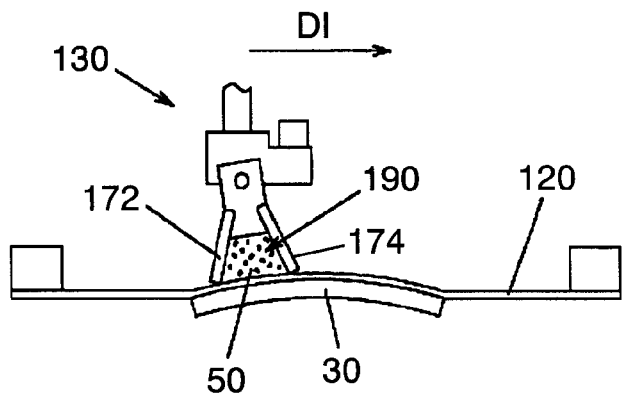
FIGS. 5A–5C are illustrations showing printing operations of screen printing apparatus according to the first embodiment of the present invention.
Figure 5B:
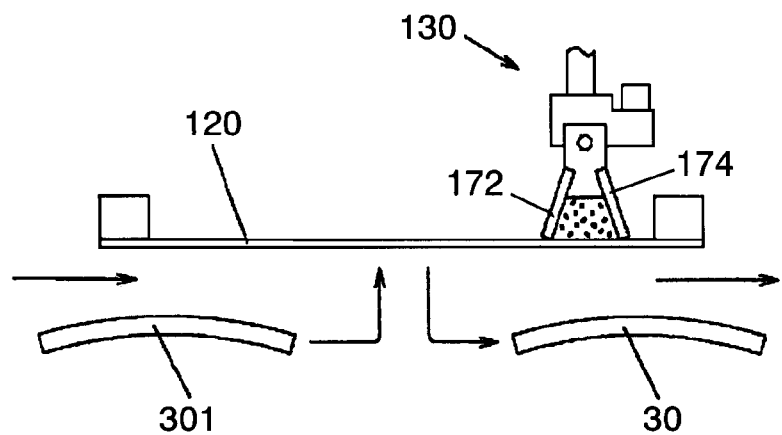
Figure 5C:
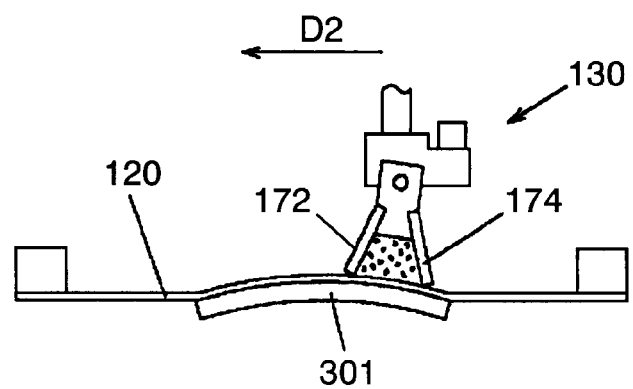

Referring to FIGS. 5A–5C, a screen printing operation of the squeegee head 130 will now be described. During the screen printing operation, the squeegee head 130 is lowered such that the lower ends of the squeegees 172 and 174 maintain contact with the upper surface of the mask plate 120. Under this condition, the cream solder 50 is supplied to the paste cell 190 from the syringe pump 260, and then the squeegee head 130 is moved in the direction of the arrow D1 shown in FIG. 5A while maintaining contact with the mask plate 120.

Accordingly, the cream solder 50 in the paste cell 190 is supplied to the pattern apertures 122 by the squeegee 172.

In the next step, with the screen printing on the substrate 30 completed, the substrate 30 is removed from the lower surface of the mask plate 120 as shown in FIG. 5B, and a new substrate 301 is placed under the lower surface of the mask plate 120 in contact with the mask plate 120, and then the squeegee head 130 is moved in the direction of the arrow D2, which is the direction opposite the direction of the arrow D1, to complete the screen printing as shown in FIG. 5C.

According to the first embodiment, the attack angle β is kept constant in both squeegeeing directions D1 and D2 during the squeegeeing operation (screen printing operation)

even if the surface of the substrate 30 is not flat, as shown in FIG. 5A. Therefore, the screen printing is always carried out under a stable condition, and fluctuation in the amount of the cream solder 50 printed on the substrates in the squeegeeing operations is prevented.

In other words, the cylinder 220 keeps applying pressure to the squeegees 172 and 174 under the condition that a pair of squeegees 172 and 174 are united such that the united squeegees are rotatable around the Y-axis which is perpendicular to the squeegeeing direction and that the lower ends of the squeegees always form the attack angles β respectively, against the mask plate 120. Accordingly, the squeegeeing is carried out while maintaining the predetermined attack angle β constant regardless of the shape of the substrate 30 including a warp or a slant of the substrate 30.

Furthermore, the first embodiment does not have a pair of squeegees that are independently operated to move up and down, though it has a pair of squeegees corresponding to both squeegeeing directions D1 and D2.

Accordingly, it is not necessary to lift and lower each squeegee for switching the squeegee when the squeegeeing direction is reversed. Therefore, loss of time caused by lifting and lowering each squeegee is prevented, and the efficiency of the screen printing is improved. Further, a solder drop may occur when the cream solder 50 attached to the squeegee drops if each squeegee is independently lifted and lowered whenever the squeegeeing direction is reversed. According to the first embodiment, however, such solder drop is prevented because lifting and lowering each squeegee for switching the squeegeeing direction is not necessary.

When lifting and lowering the squeegees are carried out by an air cylinder, the air cylinder generates pressure to push the squeegees against the mask plate. According to the first embodiment, the cylinder 220 is commonly used to generate pressure for pushing the squeegees 172 and 174. Therefore, a difference in operational characteristics caused by using different cylinders is prevented. Accordingly, the pressure applied to the squeegees 172 and 174 against the mask plate 120 is adequately maintained. Although the piston/cylinder 220 is used as an example of a linear actuator, other suitable linear actuators may be used.

Furthermore, the cream solder 50 is stored in the sealed paste cell 190 formed between the mask plate 120 and the squeegees 172 and 174. Accordingly, degradation of the cream solder 50 caused by atmospheric corrosion is reduced.

Further, the cream solder 50 is supplied to the paste cell 190 by the syringe pump 260 according to the embodiment of the present invention. Accordingly, it is not necessary to stop the screen printing apparatus or the squeegees for supplying the cream solder on the mask plate. Therefore, the rate of operation, and thus the working efficiency of the screen printing apparatus, is improved.

Furthermore, the storing condition of the cream solder 50 in the paste cell 190 is constantly maintained because the supply of the cream solder 50 to the paste cell 190 is adequately controlled by the syringe pump 260. Accordingly, the rolling condition of the cream solder 50 during the squeegeeing operation is stabilized, and the printing dispersion is reduced.

Second Embodiment

A conventional screen printing apparatus generally controls the temperature of the cream solder by blowing heat toward the cream solder provided on a mask plate. According to such conventional screen printing apparatus, there is a shortcoming that the cream solder is hardened in a short time because a solvent in the cream solder is easily volatilized.

Figure 6:
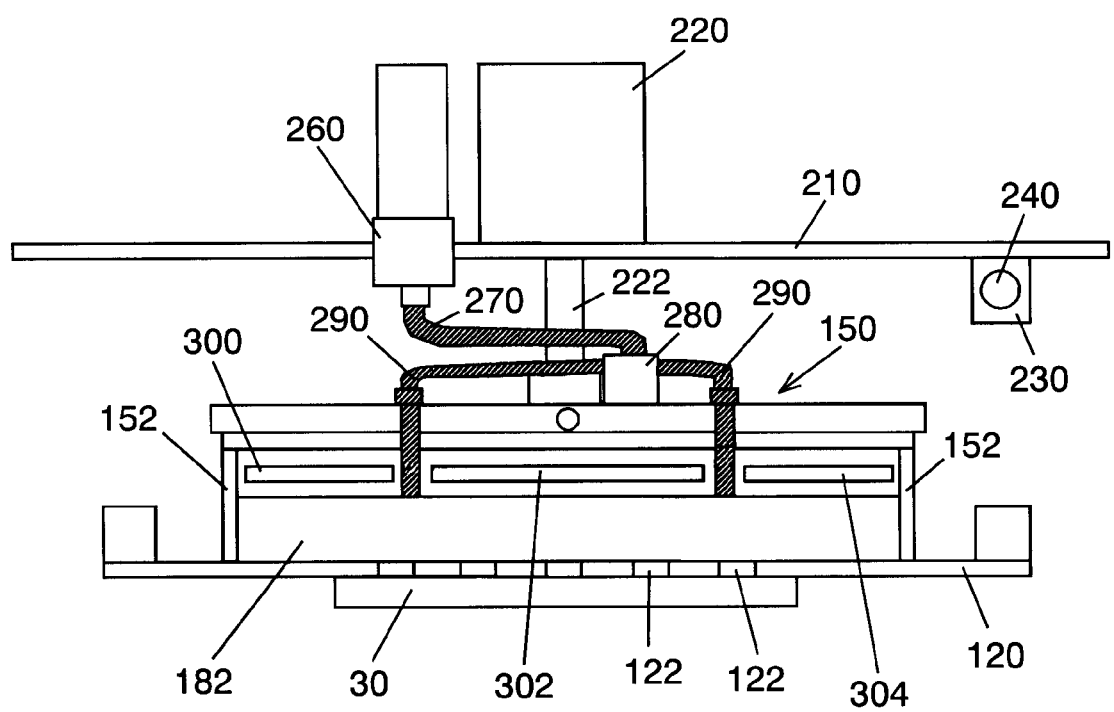
FIG. 6 is a schematic side view of a screen printing apparatus according to a second embodiment of the present invention.

A second embodiment, shown in FIG. 6, is similar to the first embodiment but arranged such that the temperature of the cream solder 50 is controlled by a temperature controller in the paste cell 190. In the second embodiment, components which are substantially the same as those in the first embodiment are assigned the same reference numerals.

According to the second embodiment, the temperature of a part of the squeegee unit 150 is controlled by a temperature controller, such as heaters 300, 302 and 304 provided on the holding plate 182, to control the temperature of the cream solder 50. Although not shown in FIG. 6, the same heaters are provided on the holding plate 184 in the same way. The heaters including the heaters 300, 302 and 304 are controlled by a controller, such as a central processing unit, which is not shown in FIG. 6. Accordingly, the temperature of the cream solder 50 is always best suited for the printing conditions.

According to the first and second embodiments of the present invention, the squeegee unit 150 including the united squeegees 172 and 174 is allowed to rotate along the X-axis and the Y-axis to follow the warp or undulations of the substrate 30. However, the first and second embodiments may be modified to additionally include a pressing force control mechanism as disclosed in U.S. Pat No. 5,996,487.

Although the present invention has been described in connection with the preferred embodiments thereof with reference to the accompanying drawings, it is to be noted that various changes and modifications will be apparent to those skilled in the art. Such changes and modifications are to be understood as being included within the scope of the present invention as defines in the appended claims.

What is claimed is:

1. A screen printing apparatus for printing paste onto a substrate via a pattern aperture of a mask plate, said screen printing apparatus comprising:

a squeegee head for printing paste onto the substrate;

a horizontal squeegee head driver operably coupled to said squeegee head; and a vertical squeegee head driver operably coupled to said squeegee head;

wherein said squeegee head includes a pair of squeegees having opposite squeegeeing directions and being arranged for lower ends thereof to slide in contact with the mask plate at predetermined attack angles with respect to said squeegeeing directions, respectively;

wherein said pair of squeegees are unitedly connected together to form a unitary squeegee pair;

wherein said squeegee head further includes a horizontal pivot arrangement operably coupled to said united squeegee pair such that said united squeegee pair is freely rotatable about a horizontal axis that is generally perpendicular to said squeegeeing directions so as to allow said united squeegee pair to slide along the mask plate while maintaining both of said pair of squeegees in contact with the mask plate with the predetermined attack angles maintained constant even when the mask plate is slanted; and wherein a paste cell, in which the paste is to be stored on the mask plate, is defined between said pair of squeegees when said pair of squeegees is in contact with the mask plate.

2. The screen printing apparatus as in claim 1, further comprising a paste pump arranged in communication with said paste cell.

3. The screen printing apparatus as claimed in claim 2, wherein said paste pump comprises a syringe pump.

4. The screen printing apparatus as in claim 2, wherein said squeegee head further includes a heater arranged to control a temperature of the paste when the paste is stored in said paste cell.

5. The screen printing apparatus as in claim 1, wherein said squeegee head further includes a heater arranged to control a temperature of the paste when the paste is stored in said paste cell.

6. The screen printing apparatus as in claim 5, wherein said heater is provided on said squeegee head.

7. The screen printing apparatus as in claim 5, wherein said horizontal squeegee head driver is arranged to move said squeegee head in a reciprocating manner along said squeegeeing directions.

8. The screen printing apparatus as in claim 1, wherein said horizontal squeegee head driver is arranged to move said squeegee head in a reciprocating manner along said squeegeeing directions.

9. The screen printing apparatus as in claim 1, wherein said squeegee head further includes a pivot arrangement constructed so that said united squeegee pair is rotatable with respect to a horizontal axis that is parallel with said squeegeeing directions.

10. The screen printing apparatus as in claim 1, wherein said vertical squeegee head driver comprises a linear actuator coupled to said squeegee head.

11. The screen printing apparatus as in claim 10, wherein said linear actuator comprises a piston/cylinder unit.

12. The screen printing apparatus as in claim 1, wherein said predetermined attack angles are the same angle for each of said pair of squeegees.

13. The screen printing apparatus as in claim 1, wherein said paste cell is further defined by at least one enclosing plate attached to at least one end of said squeegee head.

14. The screen printing apparatus as in claim 1, wherein said paste cell is further defined by a pair of enclosing plates respectively attached to opposite ends of said squeegee head.

15. The screen printing apparatus as in claim 1, wherein said predetermined attack angles are acute angles.

16. A method of screen printing for printing paste onto a substrate via a pattern aperture of a mask plate by sliding a pair of united squeegees on said mask plate, said method comprising:

placing a first substrate under said mask plate;

lowering said pair of united squeegees to make contact with said mask plate; holding said pair of united squeegees such that said pair of united squeegees is in contact with said mask plate so that attack angles formed between said squeegees and said mask plate, respectively, are acute angles;

supplying paste to a paste cell formed on said mask plate between said pair of united squeegees when said pair of united squeegees is in contact with said mask plate;

sliding said pair of united squeegees on said mask plate in a first squeegeeing direction such that said united squeegees are freely rotatable about a horizontal axis that is generally perpendicular to said first squeegeeing direction, so as to complete printing of the paste onto said first substrate while holding both squeegees of said pair of united squeegees in contact with said mask plate such that said attack angles formed between said squeegees and said mask plate, respectively, are kept constant even where the mask plate is slanted;

replacing said first substrate with a second substrate; and sliding said pair of united squeegees on said mask plate in a second squeegeeing direction opposite to said first squeegeeing direction such that said united squeegees are freely rotatable about the horizontal axis, so as to complete printing of the paste onto said second substrate while holding both squeegees of said pair of united squeegees in contact with said mask plate such that said attack angles formed between said squeegees and said mask plate, respectively, are kept constant even where the mask plate is slanted.

17. The method of screen printing as in claim 16, wherein said predetermined attack angles are the same angle for each of said pair of united squeegees.

* * * * *